United States Patent [19]
Glowasky et al.

[11] Patent Number: 6,066,389
[45] Date of Patent: May 23, 2000

[54] CONNECTOR TOW

[75] Inventors: Robert A. Glowasky, Webster Grove; Jack H. Jacobs, St. Louis; Bruce E. McIlroy, Florissant, all of Mo.; Matthew M. Thomas, Madison, Ill.

[73] Assignee: McDonnell Douglas Corporation, St. Louis, Mo.

[21] Appl. No.: 09/126,561

[22] Filed: Jul. 30, 1998

Related U.S. Application Data

[62] Division of application No. 08/473,098, Jun. 7, 1995, Pat. No. 5,851,645.

[51] Int. Cl.[7] .................................................. H01R 13/60
[52] U.S. Cl. ........................ 428/221; 428/297.7; 439/527
[58] Field of Search ................................. 428/221, 297.7; 439/527

[56] References Cited

U.S. PATENT DOCUMENTS

| | | | |
|---|---|---|---|
| 3,836,829 | 9/1974 | Eustance | 317/258 |
| 3,888,711 | 6/1975 | Breitner | 156/93 |
| 4,170,677 | 10/1979 | Hutcheson | 428/119 |
| 5,238,729 | 8/1993 | Debe | 428/245 |
| 5,500,280 | 3/1996 | Yamazaki et al. | 428/220 |

*Primary Examiner*—Elizabeth M. Cole
*Attorney, Agent, or Firm*—Alston & Bird LLP

[57] ABSTRACT

A connector tow for providing external electrical access to an electrical device embedded within a composite structure. The connector comprises a plurality of tubes disposed between a pair of opposed film layers. The film layers are adhered to opposite sides of the plurality of tubes and can be comprised of an insulating material so as to electrically isolate the plurality of tubes. By extending through the edge surface of the composite structure, the electrical ports can be accessed during the fabrication of the a composite structure such that the operations of the embedded electrical device can be monitored.

2 Claims, 4 Drawing Sheets

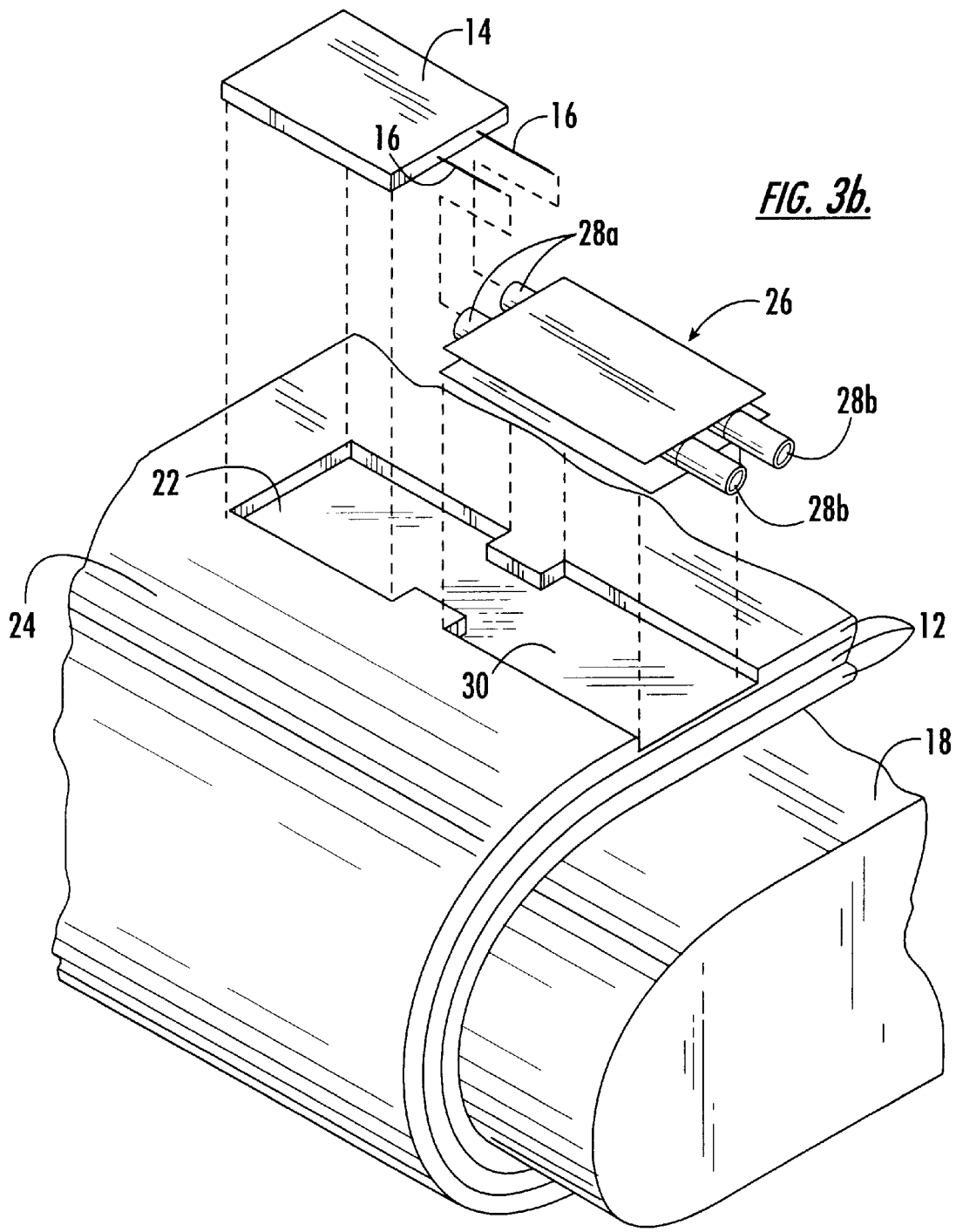

CONNECTOR TOW

This application is a division of Ser. No. 08/473,098, now U.S. Pat. No. 5,851,645. +gi

GOVERNMENT LICENSE RIGHTS

The United States Government has rights in this invention as provided for by the terms of Contract Number MDA 972-93-2-0010 on behalf of the Advanced Research And Projects Agency.

FIELD OF THE INVENTION

The present invention relates generally to composite structures and associated fabrication methods and, more particularly, to composite structures having electrical devices embedded therein and associated fabrication methods.

BACKGROUND OF THE INVENTION

Composite structures are employed in an increasing number of applications, such as a variety of automotive and aviation applications. For example, modern commercial and military aircraft include a number of composite components, such as components fabricated from fiber reinforced composites, to increase the relative stiffness and strength of the components without unnecessarily increasing the weight of the aircraft.

Regardless of the particular application, composite components can be formed by laying up or stacking a number of plies, such as on a tool or mandrel which, at least partially, defines the shape of the resulting composite structure. The plies are thereafter consolidated, such as by an autoclave process or a fiber placement process, into an integral laminate structure. As known to those skilled in the art, the consolidation process typically requires the stacked plies to be exposed to relatively high temperatures and relatively high pressures in order to sufficiently bond the plies into the integral laminate structure. For example, the consolidation of carbon fiber-reinforced plies by a fiber placement process can require temperatures as great as 1300° F. and pressures as great as 600 to 800 PSI.

In addition to conventional autoclave processes, composite components can be fabricated by a fiber placement process in which plies of fibrous tow pre-impregnated with thermoset or thermoplastic resin, typically termed prepregs, are individually placed on and consolidated to an underlying composite structure. Preferably, a laser heats the lower surface of the fiber-placed ply and the upper surface of the underlying composite structure to at least partially melt a localized region of the ply. Compactive pressure is then applied to the at least partially molten region of the ply, such as by a roller disposed downstream of the laser, so as to consolidate the fiber-placed ply and the underlying composite structure, thereby forming the integral laminate structure. One advantage of a fiber placement process is that the composite material can be cured on the fly, thereby reducing the time required to fabricate a composite part.

Another method of fabricating composite components is a resin transfer molding (RTM) process. According to a RTM process, a number of fibers, such as graphite or glass fibers, are woven to form a woven fiber intermediate structure. For example, the fibers can be woven on a loom-type structure as known to those skilled in the art. Resin can then be introduced to the woven fiber intermediate structure such that, once the resin has cured, the resulting composite component formed from the resin-impregnated woven fiber structure is created.

An emerging area of interest with respect to composite structures, regardless of the particular method by which composite components are fabricated, involves the design and development of smart structures. Smart structures generally refers to composite structures which include one or more interactive electronic devices. For example, monolithic or multi-layer electroceramic actuators can be embedded within a composite structure so as to induce vibrations within the composite structure. In particular, an electroceramic actuator can induce vibrations in the composite structure in order to offset or damp externally induced vibrations of the composite structure. In addition, smart structures can include other electrical devices, such as antennas and integrated circuits.

In order to protect the embedded electrical device during the fabrication of the composite structure by an autoclave or fiber placement process, the electrical device is preferably disposed within a trough formed in a ply of composite material. Thereafter, additional composite layers can be stacked on the ply and consolidated thereto to form an integral laminate composite structure in which the electrical device is embedded. Alternatively, the electrical device can be embedded within the woven fiber intermediate structure prior to doping the structure with resin in a RTM process.

Even if the electrical device withstands the fabrication process, including the relatively high temperatures and relatively high pressures to which the device is exposed during consolidation, the electrical device must still be able to receive, and in many instances, transmit signals in order to function as desired. Accordingly, the embedded electrical device, such as an electroceramic actuator, typically includes a pair of electrical leads which are routed to the surface of the resulting composite structure in order to provide for an external electrical connection, such as with an external controller. In addition, numerous composite structures include one or more plies which are comprised of a conductive material. Therefore, the electrical leads of the embedded electrical devices are typically coated with an insulating material, such as Kapton™ material, in order to electrically isolate the electrical leads from the conductive plies of the composite structure.

A composite structure generally includes inner and outer surfaces through which the electrical leads of the embedded electrical device extend. In order to facilitate connection with other electrical devices, the electrical leads are typically routed through the inner surface of the resulting composite structure. Accordingly, troughs or bores must be formed or cut in the composite structure, such as from the interior surface thereof, so that the electrical leads can extend therethrough.

However, the surface egress of the electrical leads of an embedded electrical device as described above is primarily effective in instances in which a hollow composite structure is fabricated, such as a trapezoidal rail, which permits the electrical leads to be routed to the hollow interior of the composite structure. In contrast, in instances in which the composite structure is not hollow, such as a solid or a relatively planer composite structure, the surface egress of the electrical leads of the embedded electrical device is less effective since the electrical leads will protrude from a surface, such as the exterior surface, of the composite structure and may interfere with the performance of the structure. For example, electrical leads which protrude through the exterior surface of a composite fairing can be exposed to potentially harmful environmental conditions, can create undesirable wind resistance and can otherwise impair the performance of the composite structure.

Even if the resulting composite structure is hollow, the electrical leads must oftentimes be secured within the respective troughs defined in the composite structure with an adhesive in order to retain the electrical leads within the respective troughs. However, the application of adhesive within the trough can complicate the fabrication process by impairing the placement and consolidation of additional plies over the embedded electrical device.

As described above, composite structures are oftentimes formed by stacking or laying up a plurality of plies on a tool which defines, at least in part, the shape of the resulting composite structure. Accordingly, in order to route the electrical leads from the embedded electrical device through the interior surface of the composite structure, the tool, such as a mandrel, must be hollow so as to define an internal cavity into which the electrical leads must extend. Thus, the trough defined in the composite structure through which the electrical leads extend must be carefully aligned with a corresponding aperture defined by the mandrel such that the electrical leads can extend through the aperture defined in the mandrel and into the internal cavity of the hollow mandrel. In addition, the electrical leads might need to be secured within the respective apertures using specialized tools which may, in turn, further impair the placement and consolidation of additional plies over the egressed lead.

Due to the construction of a conventional breakdown mandrel, the internal cavity of the mandrel cannot generally be accessed during the fabrication of a composite structure. Accordingly, the electrical leads extend into and are disposed within the hollow mandrel in a random order. Thus, the electrical leads can become entangled with other electrical leads or with other surface-egressed components, such as optical fibers, to form a tangled web which is relatively difficult to disentangle. In addition, the electrical leads which extend into the hollow mandrel can sever other surface-egressed components, such as optical fibers, and can render repair of the several components difficult, thereby impairing the performance of the resulting composite structure.

SUMMARY OF THE INVENTION

It is therefore an object of the present invention to provide an improved composite structure having an embedded electrical device therein.

It is another object of the present invention to provide an improved connector tow for providing external access to an electrical device embedded within a composite structure.

It is a further object of the present invention to provide an improved method for fabricating a composite structure having an externally accessible electrical device embedded therein.

It is yet another object of the present invention to provide a method of monitoring an electrical device embedded within a composite structure during fabrication of the composite structure.

These and other objects are provided, according to the present invention, by a composite structure and associated method of fabrication which includes at least one tube disposed within the composite structure and extending from a first end at which the tube is electrically connected to an electrical lead of an embedded electrical device to an opposed second end which opens through the edge surface of the composite structure to thereby define an externally accessible electrical port. The externally accessible electrical port is adapted to receive a corresponding connector such that an electrical connection can be established via the electrical lead with the embedded electrical device.

The composite structure of one embodiment includes a plurality of stacked plies which form a multi-ply laminate structure. The laminate structure has opposed inner and outer surfaces and an edge surface extending between the inner and outer surfaces and along a peripheral edge thereof. An electrical device, such as an electroceramic actuator, an antenna or an integrated circuit, having at least one electrical lead is disposed within the laminate structure. At least one tube is also disposed within the laminate structure and is electrically connected, such as by crimping, to the electrical lead of the embedded electrical device. Alternatively, the composite structure can include a resin-impregnated woven fiber structure, such as produced by an RTM process, in which the electrical device is embedded.

Typically, the composite structure includes a plurality of tubes comprised of a conductive material. In one advantageous embodiment, the plurality of tubes are disposed between and adhered to first and second film layers to thereby form a connector tow. The first and second film layers are adhered to opposite sides of the plurality of tubes such that the relative position of the tubes are fixed. In one embodiment, at least one of the plurality of plies is comprised of a conductive material such that the resulting composite structure is at least partially conductive. In this embodiment, the first and second film layers are preferably comprised of an electrically insulating material, such as polyetheretherketone or polyetherimide, such that the plurality of conductive tubes are electrically isolated from the conductive ply. Consequently, by inserting a corresponding connector into the electrical port defined by the second end of a conductive tube which opens through the edge surface of the laminate structure, electrical contact can be established with the embedded electrical device.

According to one embodiment, the composite structure of the present invention is fabricated by providing at least one supporting ply which can be laid upon a fixed tool which at least partially defines the shape of the resulting composite structure. By employing a fixed, as opposed to a break-down tool, the complexity and materials cost of the tool can be significantly reduced.

The supporting ply has first and second opposed surfaces and defines first and second depressions extending inwardly from the first surface thereof. The electrical device of this embodiment is disposed within the first depression and a connector tow having at least one tube is disposed within the second depression and is electrically connected to an electrical lead of the electrical device. At least one additional ply can thereafter be stacked on the first surface of the supporting ply and the stacked plies can then be consolidated to form an integral laminate structure. Alternatively, the composite structure can be formed by an RTM process in which a woven fiber structure is formed which has an electrical device and an associated connector tow embedded therein.

By accessing the second end of the tube, such as by machining the edge surface of the laminate structure to thereby expose the second end of the tube, the externally accessible electrical port can be defined at considerable cost savings than a separate operation would require. A male connector can then be inserted into the second end of the tube which opens through the edge surface of the laminate structure to electrically contact the embedded electrical device.

According to another embodiment of the present invention, electrical contact can be established and maintained with the electrical lead of the electrical device via the externally accessible electrical port during the consolidation process. In one embodiment, electrical contact is maintained while stacking additional plies on the first surface of the supporting ply and while consolidating the stacked plies to form the integral laminate structure. Consequently, the operations of the embedded electrical device can be monitored to determine if the electrical device continues to perform properly. In particular, electrical contact is preferably established with the embedded electrical device by inserting a male connector into the second end of the tube which extends at least to the edge surface of the supporting ply.

Accordingly, a composite structure, such as a smart structure, having an embedded electrical device can be fabricated which includes a connector tow having at least one tube which opens through the edge surface of the composite structure to define an electrical port which provides external electrical access to the embedded electrical device. By being embedded within the composite structure according to the present invention, the electrical device and the connector tow are at least partially protected from the relatively high temperatures and high pressures to which the composite structure is exposed during the consolidation process. In addition, the connector tow can electrically isolate the conductive tubes from the composite structure such that electrical contact can be made within an at least partially conductive composite structure.

Consequently, in one embodiment, the embedded electrical device can be monitored during and following the process of fabricating the composite structure to determine if the relatively high temperatures and high pressures required for consolidation have adversely affected the operations of the electrical device. Furthermore, the composite structure of the present invention also provides ready access to the respective second ends of the plurality of tubes, by machining or cutting the edge surface of the composite structure, to thereby more precisely define the electrical ports, such as in instances in which the edge surface is damaged or the second ends of the tubes are embedded within the composite structure during the fabrication process.

BRIEF DESCRIPTION OF THE DRAWINGS

FIG. 3b is a perspective view illustrating the formation of first and second depressions in the supporting ply and indicating the insertion of the electrical device and the connector tow in the respective depressions.

DETAILED DESCRIPTION OF THE PREFERRED EMBODIMENT

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. Like numbers refer to like elements throughout.

Figure 1:
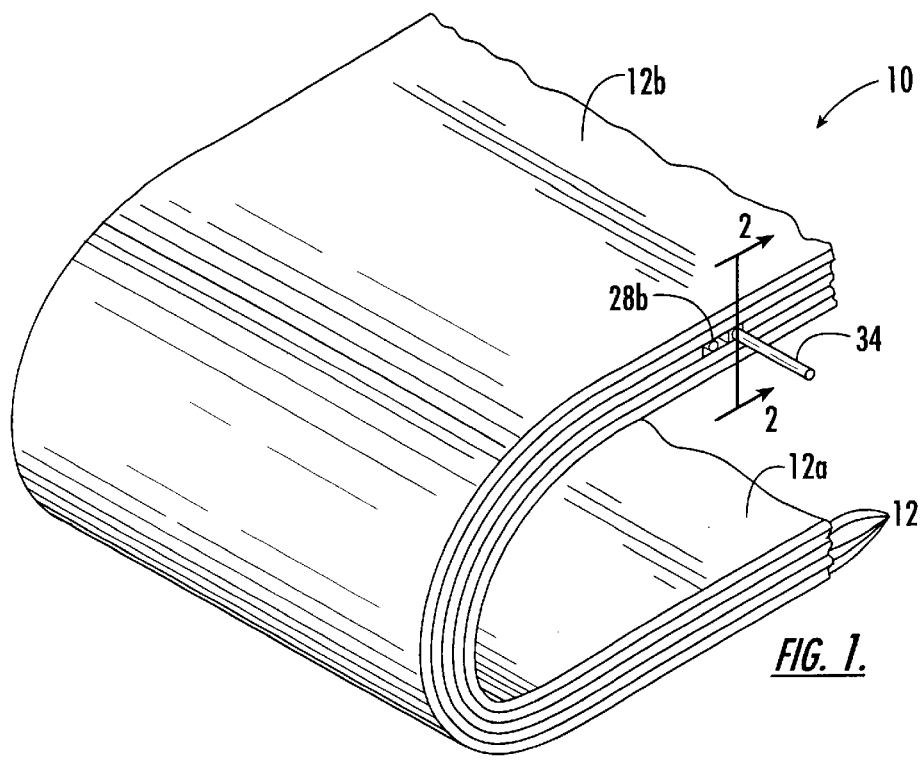
FIG. 1 is a perspective view of a composite structure according to one embodiment of the present invention illustrating the respective second ends of a pair of tubes which open through the edge surface of the composite structure.

Referring now to FIG. 1, a composite structure 10 according to the present invention is illustrated. For example, the composite structure can be an automotive component or an aircraft component, such as a rudder, fairing or aileron. The composite structure of the illustrated embodiment is comprised of a plurality of plies 12 which are stacked and consolidated to thereby form a multi-ply laminate structure. The plies can be laid up and consolidated in any manner known to those skilled in the art, such as by a conventional autoclave curing process or by a fiber placement process.

In addition, while a composite structure 10 having a plurality of plies 12 and which is fabricated by an autoclave or fiber placement process is described and illustrated herein, the composite structure can be formed by resin transfer molding (RTM) in which a number of fibers, such as graphite or glass fibers, are woven to form a woven fiber intermediate structure. For example, the fibers can be woven on a loom-type structure as known to those skilled in the art. Resin can then be introduced to the woven fiber intermediate structure such that, once the resin has cured, the resulting composite component is formed.

In addition, while the specific materials comprising the plurality of plies 12 or the woven fiber intermediate structure can be any of a variety of composite materials known to those skilled in the art, the plies are typically comprised of carbon fiber-reinforced composite materials which provide increased strength and stiffness in comparison with comparable metallic structures without unnecessarily increasing the weight of the resulting part. As known to those skilled in the art, carbon fiber-reinforced composite materials are generally conductive. However, the composite structure 10 of the present invention can be comprised of nonconductive or insulating plies, such as fiberglass plies, without departing from the spirit and scope of the present invention.

Figure 2:
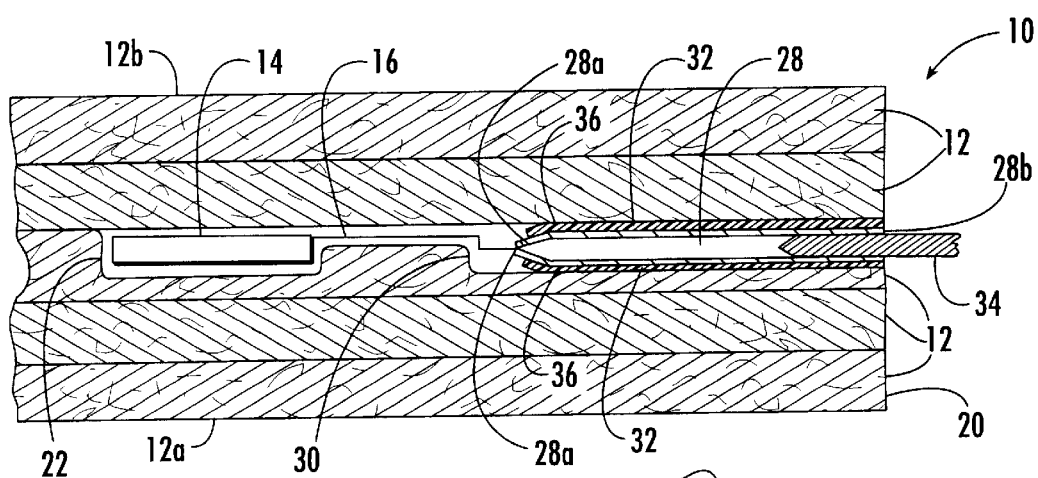
FIG. 2 is a cross-sectional view of the composite structure of the embodiment illustrated in FIG. 1 taken along line 2—2 and illustrating the embedded electrical device and the embedded connector tow.

As illustrated in cross-section in FIG. 2, an electrical device 14 is preferably disposed within a composite structure, such as the illustrated multi-ply laminate structure or a woven fiber intermediate structure. The electrical device can include, for example, a monolithic or multi-layer electroceramic actuator, which can induce vibrations within the composite structure 10. More specifically, the electroceramic actuator can induce vibrations in the composite structure to offset or damp externally introduced vibrations. For example, one conventional electroceramic actuator is commercially available from Active Control Experts of Cambridge, Mass. While a composite structure which includes an electroceramic actuator is described and illustrated herein, the composite structure can include a variety of other types of electrical devices without departing from the spirit and scope of the present invention. For example, the electrical device can include an antenna or an integrated circuit which is embedded within the composite structure.

Regardless of the type of electrical device 14, however, the electrical device includes at least one electrical lead 16 and, in most instances, two or more electrical leads for transmitting signals to and receiving signals from an external source, such as an external controller or a central computer. Consequently, the external source can monitor or actively control the embedded electrical device of the smart composite structure 10.

Figure 3A:
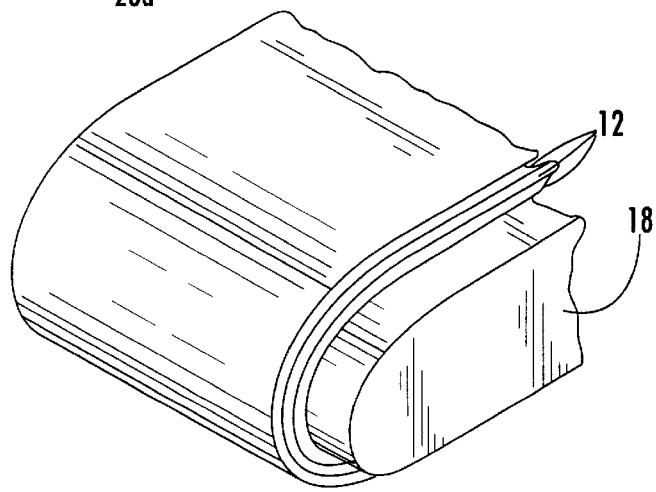
FIG. 3a is a perspective view illustrating a plurality of supporting plies laid up about a fixed tool.

As illustrated by FIG. 3*a*, the plies 12 can be laid up so as to define a composite structure 10 having a predetermined shape. As shown, the plies can be laid up on a tool 18, such as a mandrel, which, at least partially, defines the predetermined shape of the resulting composite structure. For example, the tool can define a sharply curved surface such that the resulting composite structure forms a rudder or fairing. In addition, the tool can be a fixed or solid tool since the electrical leads 16 of the embedded electrical device 14 are not routed to the interior of the tool, but are, instead, routed to an edge surface 20 of resulting composite structure. Consequently, the complexity and cost of the tool can be significantly reduced in comparison with breakdown tools employed during the fabrication of conventional smart structures.

As shown in FIG. 3*b*, the electrical device 14 is disposed within the multi-ply laminate structure during the fabrication of the composite structure 10 by forming a first depression 22 within at least one supporting ply 12 by removing material, such as by routing, from a predetermined area of the supporting ply. In particular, the supporting ply has first and second opposed surfaces. As shown, the first depression is preferably formed so as to extend inwardly from the first surface 24 of the supporting ply. By disposing the electrical device within the first depression defined by the supporting ply such that the electrical device is flush with or below the plane defined by the first surface of the supporting ply, the electrical device is at least partially protected from the relatively high pressures and high temperatures required to consolidate the plurality of stacked plies into the resulting integral laminate structure.

While an autoclave or fiber placement process is illustrated and described, the composite structure 10 can be formed by an RTM process as described above. In this embodiment, the electrical device 14 and, as described below, a connector tow 26 are embedded within the woven fiber intermediate structure prior to doping the intermediate structure with resin. Accordingly, once the resin with which the woven fiber intermediate structure is impregnated cures, the electrical device is effectively captured within the resulting composite structure.

Figure 4:
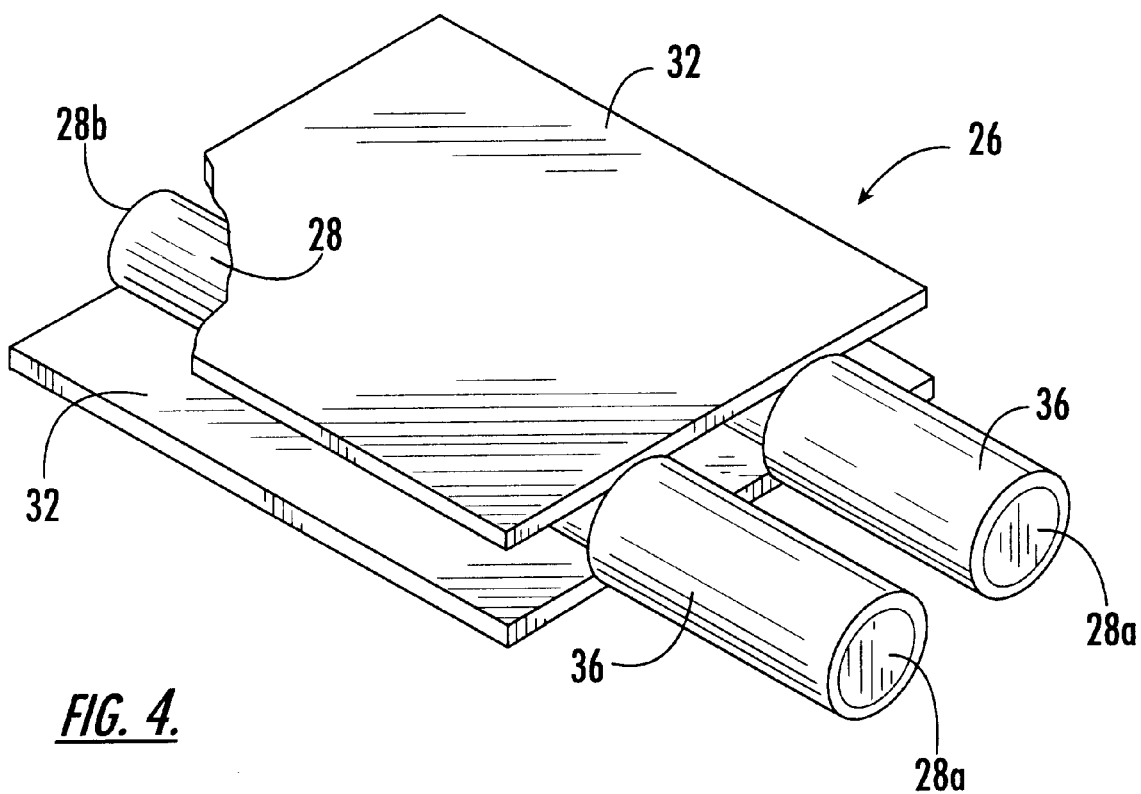
FIG. 4 is a perspective view of a connector tow according to one embodiment of the present invention illustrating a pair of tubes disposed between first and second film layers.

The composite structure 10 also includes a connector tow 26 including at least one tube 28 and, as shown in FIG. 4, two tubes disposed within the laminate structure. In this embodiment, the connector tow can be disposed within the second depression 30 defined in the supporting ply 12 as shown in FIG. 3*b*. As described in connection with the embedded electrical device 14 and as shown in FIG. 3*b*, the second depression is preferably formed, such as by removing material from the supporting ply, to a depth such that the connector tow is flush with or below the plane defined by the first surface 24 of the supporting ply. Thus, the connector tow will also be at least partially protected from the relative high temperatures and pressures required to consolidate the plurality of stacked plies into an integral laminate structure.

Each tube 28 extends longitudinally from a first end 28*a* to an opposed second end 28*b* and defines a lengthwise extending bore therethrough. For example, the tube can be a hypodermic tube comprised of a conductive material, such as stainless steel. Preferably, the tubes are both electrically and thermally conductive such that the tubes can effectively remove heat from the embedded electrical device. In one embodiment, the tubes have an outer diameter of 0.020 inches and an inner diameter of 0.010 inches. However, the tubes can have a variety of dimensions and be comprised of a variety of materials without departing from the spirit and scope of the present invention. In addition, while the tube is illustratively shown as being circular in lateral cross-section, the tube can be formed in a variety of cross-sectional shapes, such as rectangular, elliptical or square, without departing from the spirit and scope of the present invention.

The connector tow 26 preferably includes at least as many tubes 28 as the embedded electrical device 14 has electrical leads 16, such as two in the illustrated embodiment. In addition, the tubes are preferably disposed between first and second film layers 32. In particular, the first and second film layers are typically adhered to opposite sides of the tubes, such as the top and bottom sides as illustrated, between the respective first and second ends 28*a* and 28*b* of the tubes. Thus, the relative positions of the tubes are fixed. While a variety of adhesives can be employed to bond the first and second film layers to the plurality of tubes, an adhesive marketed by Ciba-Geigy under the tradename Uralane 5774 can be employed. In one embodiment, the adhesive has a thickness of 0.025 inches to 0.030 inches. However, the adhesive can have various thicknesses without departing from the spirit and scope of the present invention.

As shown in cross-section in FIG. 2, the first end 28*a* of each tube 28 is preferably electrically connected to a respective electrical lead 16 of the electrical device 14. For example, the first end of each conductive tube can be crimped about the respective electrical lead to physically secure and establish electrical contact with the electrical lead.

As also illustrated in FIG. 2, the respective second end 28*b* of each of the tubes 28 preferably extends at least to the peripheral edge of the supporting ply 12 and, more preferably, extends beyond the peripheral edge of the supporting ply. However, even if the respective second ends of the plurality of tubes are embedded within the plies of composite material during the fabrication of the composite structure 10, the respective second ends of the tubes can be subsequently accessed as described hereinafter without departing from the spirit and scope of the present invention. In addition, the tubes can also interconnect two or more embedded electrical devices within the composite structure such that the plurality of electrical devices can communicate in a more complex architecture.

Figure 3C:
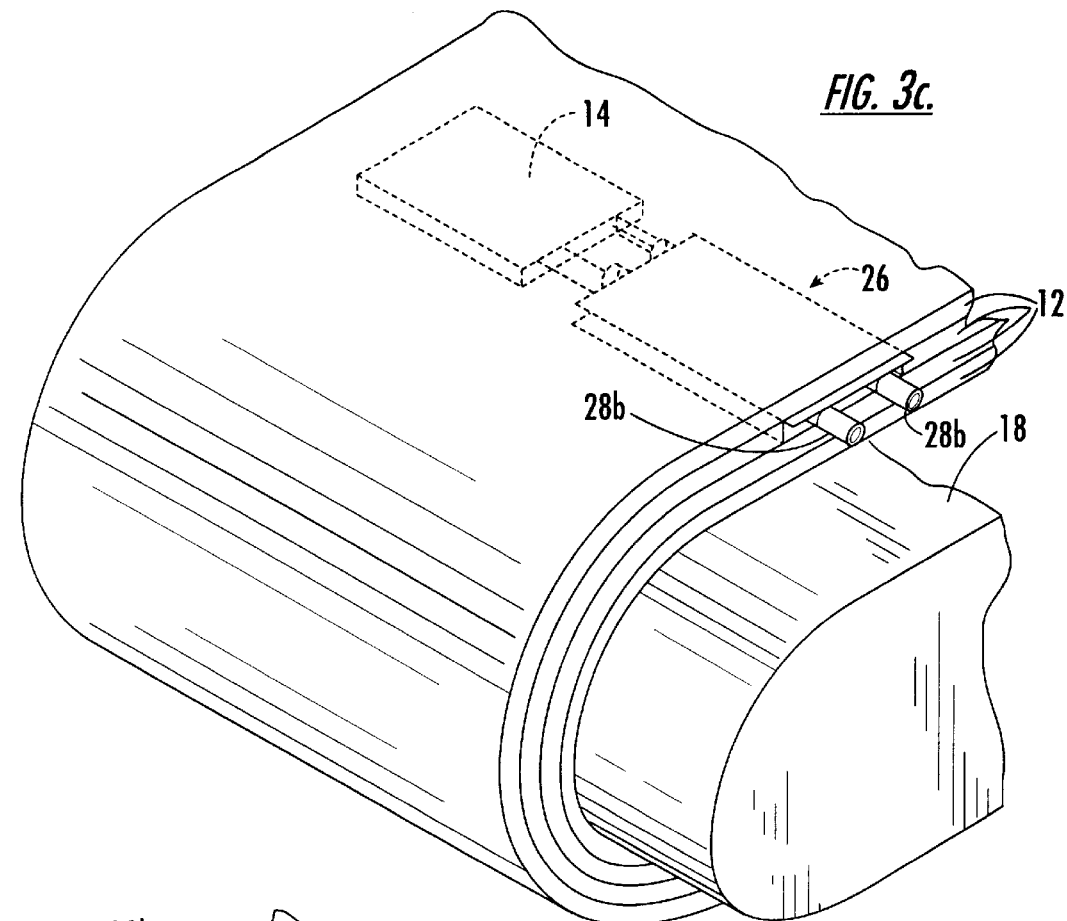
FIG. 3c is a perspective view illustrating the stacking of an additional ply on the first surface of the supporting ply so as to embed the electrical device and the connector tow within the composite structure.

Once the electrical device 14 and the connector tow 26 have been disposed within the first and second depressions 22 and 30, respectively, of the supporting ply 12 and the first end 28*a* of each tube 28 has been electrically connected to a respective electrical lead 16 of the electrical device, at least one additional ply can be stacked on the first surface of the supporting ply, as illustrated in FIG. 3*c*, so as to embed the electrical device and the connector tow within the stacked plies. As illustrated in the cross-section in FIG. 2, a plurality of additional plies are preferably stacked on the first surface of the supporting ply to form the resulting multi-ply laminate structure of the illustrated embodiment. Thereafter, the stacked plies can be consolidated to form an integral laminate structure. As known to those skilled in the art, the consolidation of the stacked plies by a fiber placement process typically requires exposure of the stacked plies to relatively high temperatures, such as 1300° F., and to the application of relatively high pressures such as 600 to 800 PSI. As also known to those skilled in the art, a fiber placement process heats a localized region of the uppermost ply, such as by a laser, prior to application of a compactive force, such as by a roller. Alternatively, the additional plies can be consolidated by a conventional autoclave curing process. Further, the composite structure in which the electrical device and connector tow are embedded can be fabricated by a RTM process.

As best illustrated in FIG. 1, the resulting integral laminate structure has opposed inner and outer surfaces 12a and 12b, respectively, and an edge surface 20 extending between the inner and outer surfaces and along a peripheral edge of the laminate structure. As also shown in FIGS. 1 and 2, the respective second end 28b of the tubes 28 of the connector tow 26 open through the edge surface of the laminate structure to thereby define a pair of externally accessible electrical ports. The electrical ports are adapted to receive corresponding connector 34 such that electrical contact can be established between each electrical lead 16 of the electrical device 14 and an external electrical device. For example, a male connector can be inserted within the second end of a respective tube to establish electrical contact with the electrical lead electrically connected to the first end 28a of the conductive tube as shown in FIG. 2.

Consequently, a smart composite structure 10 can be fabricated which includes an externally accessible electrical device 14 embedded therein. An external device, such as an external controller or a central computer, can thereby establish electrical contact with the embedded electrical device, such as an electroceramic actuator, an antenna or an integrated circuit, so as to monitor or control the operations of the embedded electrical device.

As described above, the composite structure 10 can be comprised of at least one and, in many instances, a plurality of plies 12 comprised of a conductive material, such as carbon fiber-reinforced materials. Alternatively, the composite structure can be comprised of a number of fibers, such as conductive fibers, which form a woven structure. Accordingly, the electrical connection provided by the connector tow 26 of the present invention is preferably electrically isolated from the conductive composite structure. In particular, the first and second film layers 32 are preferably comprised of an insulating material, such as polyetheretherketone or polyetherimide, such that the plurality of conductive tubes 28 disposed therebetween are electrically isolated from the conductive composite structure.

In addition, in embodiments of the present invention in which an end portion of a tube 28 extends beyond the first and second insulating film layers 32, the portion of the tube which extends beyond the film layers is also preferably electrically isolated from the conductive composite structure 10, such as by wrapping the portion of the tube which extends beyond the film layers with a sheet 36 of insulating material, such as polyamide. For example, as shown in FIGS. 2 and 4, the first end 28a of each tube extends beyond the first and second insulating film layers and is wrapped with a sheet of insulating material. Accordingly, the conductive tubes can be electrically isolated from the conductive composite structure.

In addition, the electrical leads 16 generally include a conductor coated with an insulating jacket, such a jacket comprised of a Kapton™ material, to provide electrical isolation from the conductive composite structure 10. Consequently, electrical contact can be established via the externally accessible electrical ports defined by the respective second ends 28b of the tubes 28 which open through the edge surface 20 of the laminate structure without electrically contacting the conductive composite structure.

During the fabrication of the composite structure, the second end 28b of each tube 28 can extend beyond the edge surface 20 of the laminate structure. Accordingly, electrical contact can be established with each electrical lead 16 of the electrical device 14 via respective externally accessible electrical ports during the fabrication process as shown in FIG. 3c. Accordingly, the operations of the electrical device can be monitored during the fabrication process, such as while stacking additional plies 12 upon the first surface 12a of the supporting ply and during the consolidation of the stacked plies into an integral laminate structure. By monitoring the operations of the electrical device during the fabrication of the composite structure, it can be determined if the operations of the embedded electrical device are impaired or otherwise damaged by the relatively high temperatures and relatively high pressures to which the composite structure is subjected during the consolidation process. For example, an external controller or central computer can be connected, via one or more connectors 34 which are inserted within the second ends of respective tubes, to the embedded electrical device so as to periodically test or monitor the embedded electrical device.

Figure 3D:
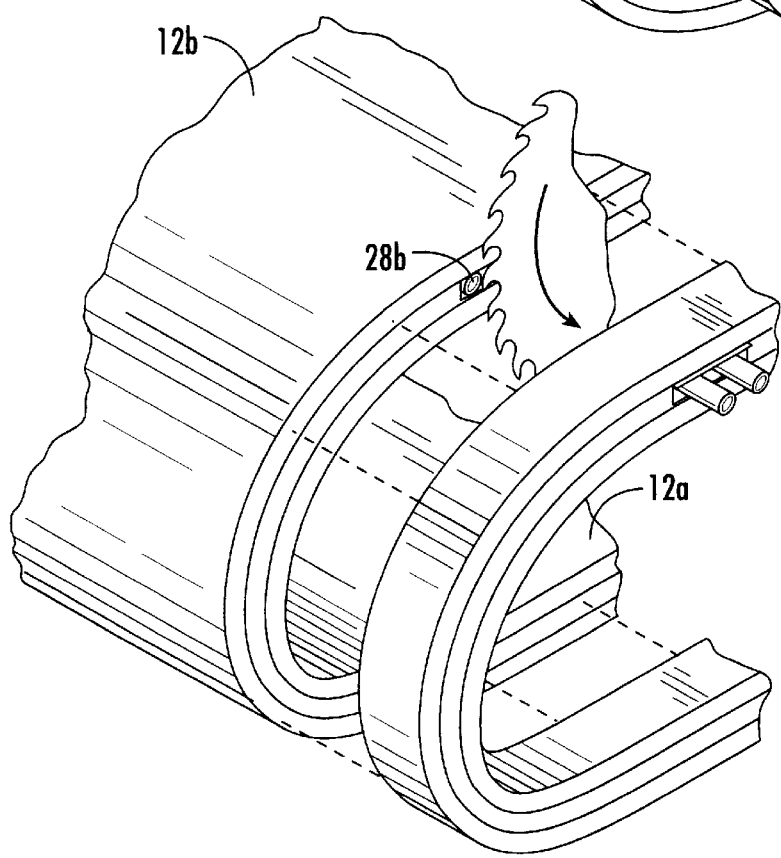
FIG. 3d is a perspective view illustrating the machining of an edge surface of the resulting composite structure to thereby expose the respective second ends of the pair of tubes which define a pair of externally accessible electrical ports.

Alternatively, the respective second ends 28b of the tubes 28 can be embedded within the composite structure 10 during the fabrication process. In this embodiment, the respective second ends of the tubes are preferably accessed following the consolidation of the stacked plies 12 into an integral laminate structure. In particular, the edge surface 20 of the resulting laminate structure can be machined, such as by sawing, to thereby expose the respective second ends of the tubes as shown in FIG. 3d. In one embodiment, a water cooled diamond-tipped saw can be employed to cut or remove a portion of the edge surface of the laminate structure, thereby exposing the second end of each tube. Thereafter, corresponding connectors 34 can be inserted in the respective ports defined by the open second ends of the tubes in order to establish electrical contact with the embedded electrical device 14. Consequently, the edge surface as the laminate structure can be machined following the fabrication process to repair or eliminate any imperfections in the edge surface and to insure that the end portions of the connectors are flush with the edge surface without damaging the externally accessible electrical ports defined by the respective second ends of the plurality of tubes.

Accordingly, a composite structure 10, such as a smart structure, having an embedded electrical device 14 can be fabricated which includes a connector tow 26 having at least one tube 28 which opens through the edge surface 20 of the composite structure to define an electrical port which provides external electrical access to the embedded electrical device. By sandwiching the conductive tubes of the connector tow between a pair of insulating film layers 32, the connector tow, including the conductive tubes, can be electrically isolated from the composite structure, such as a conductive composite structure. Consequently, in one embodiment, the embedded electrical device can be monitored during and following the process of fabricating the composite structure to determine if the relatively high temperatures and high pressures required to consolidate the stacked plies 12 into an integral laminate structure has adversely effected the operations of the electrical device.

The composite structure of the present invention also provides ready access to the respective second ends 28b of the plurality of tubes, by machining or cutting the edge surface of the composite structure, to thereby more precisely define the electrical ports, such as in instances in which the edge surface is damaged or the second ends of the tubes are embedded within the composite structure during the fabrication process.

In the drawings and the specification, there has been set forth preferred embodiments of the invention, and, although specific terms are employed, the terms are used in a generic and descriptive sense only and not for the purpose of limitation, the scope of the invention being set forth in the following claims.

That which is claimed is:

1. A connector tow for providing external electrical access to an electrical device embedded within a composite structure, the connector tow comprising:

a plurality of tubes comprised of a conductive material, wherein each of said tubes extends longitudinally from a first end to an opposed second end, and wherein each of the tubes defines an opening extending longitudinally therethrough; and first and second insulating film layers adhered to opposite sides of said plurality of conductive tubes between the respective first and second ends of said plurality of tubes such that the relative positions of said plurality of conductive tubes are fixed and such that said plurality of tubes are electrically isolated from the conductive composite structure, wherein the first end of each conductive tube is capable of electrically contacting a respective electrical lead of the embedded electrical device, and wherein the second end of each tube is capable of opening through a surface of the composite structure to thereby define an externally accessible electrical port for receiving a corresponding connector such that electrical contact is capable of being established via the respective electrical lead with the embedded electrical device.

2. A connector tow according to claim 1 wherein said first and second film layers are comprised of an insulating material selected from the group consisting of polyetheretherketone and polyetherimide.

* * * * *